United States Patent [19]

Hausmann

[11] Patent Number: 5,719,498

[45] Date of Patent: Feb. 17, 1998

[54] METHOD AND APPARATUS FOR OBTAINING A MAGNETIC RESONANCE IMAGE FROM A NUMBER OF SLICES OF AN EXAMINATION SUBJECT

[75] Inventor: Richard Hausmann, Erlangen, Germany

[73] Assignee: Siemens Aktiengesellschaft, Munich, Germany

[21] Appl. No.: 693,755

[22] Filed: Aug. 7, 1996

[30] Foreign Application Priority Data

Aug. 11, 1995 [DE] Germany .................. 195 29 636.2

[51] Int. Cl.$^6$ ............................................... G01V 3/00
[52] U.S. Cl. ............................... 324/309; 324/307
[58] Field of Search ........................... 324/309, 307, 324/306, 300, 312

[56] References Cited

U.S. PATENT DOCUMENTS

| | | | |
|---|---|---|---|
| 4,431,968 | 2/1984 | Edelstein et al. | 324/309 |
| 4,871,966 | 10/1989 | Smith et al. | 324/309 |
| 5,512,827 | 4/1996 | Hardy et al. | 324/309 |
| 5,514,957 | 5/1996 | Tatebayashi | 324/309 |
| 5,514,962 | 5/1996 | Cline et al. | 324/309 |
| 5,584,293 | 12/1996 | Darrow et al. | 324/309 |

*Primary Examiner*—Louis M. Arana
*Attorney, Agent, or Firm*—Hill, Steadman & Simpson

[57] ABSTRACT

In a method and apparatus for obtaining a magnetic resonance image from a number of slices of an examination subject, a survey image is generated perpendicular to desired slices which are to be imaged, and the desired slices are graphically positioned within the survey image. A three-dimensional data set is then obtained which includes the desired slices, and the desired slices are reconstructed from the three-dimensional data set, thereby obtaining image data. An image of the desired slices is then displayed using the image data.

6 Claims, 4 Drawing Sheets

METHOD AND APPARATUS FOR OBTAINING A MAGNETIC RESONANCE IMAGE FROM A NUMBER OF SLICES OF AN EXAMINATION SUBJECT

BACKGROUND OF THE INVENTION

1. Field of the Invention

The present invention is directed to a method for obtaining an MR image from a number of slices, and to an apparatus for conducting the method

2. Description of the Prior Art

In two-dimensional MR imaging, slices of interest of the subject under examination are excited, and individual images are obtained from these slices. It is known, e.g. from U.S. Pat. No. 4,871,966, to excite at least one additional slice during the repetition time of the pulse sequence for another slice. If, as is generally standard, it is desired to observe several slices of the subject under examination, examination time can be saved corresponding to the number of slices excited within a repetition time $T_R$.

A commonly used application of MR imaging is the examination of intervertebral disks in transverse slices. If the region of the lumbar vertebrae is to be examined, the respective slices should be inclined to one another corresponding to the curvature of the spinal column. In the U.S. Pat. No. 4,871,966 noted above, it was thus proposed to incline the slices, relative to one another, excited during a repetition time $T_R$. The position and inclination of the different slices before the measurement are determined on the basis of a sagittal survey image, representing, for example, a longitudinal section through the lumbar vertebra. This ensues by drawing lines into the visual representation of the sagittal section using a cursor, the lines determining the slices that are subsequently to be measured. The cursor is typically controlled by a mouse.

By this method, a number of transverse sectional images can be obtained relatively rapidly, particularly in the region of the lumbar vertebrae. The method is also easy to use as part of a clinical routine, since the slice can be graphically predetermined, and there is a clear geometrical connection between the lines on the survey image and the measured slices. This type of measurement of several slices is, however, also subject to a series of limitations. If, for example, the patient moves between the generation of the survey image and the subsequent slice measurements, the measured slice positions no longer correspond to the specifications. The entire measurement must then be carried out again. This risk is not inconsiderable, since after the analysis of the survey image, the physician must consider the number, position and inclination of the individual slices, and must finally carry out the graphic slice selection. A considerable time thus elapses between the survey image and the measurement of the individual slices, during which time the patient may under some circumstances not remain completely still. In addition, it can happen that after the measurement the physician may determine that the selection of slices was not optimal. In this case as well, the entire measurement process must be repeated, the patient in some circumstances already having been removed from the examination chamber when the physician determines such flaws.

In addition, it is known, e.g. from U.S. Pat. No. 4,431,968, to obtain a three-dimensional image data set by means of magnetic resonance. Normally, the entire subject volume is not included, but rather one disk is chosen at first, within which a three-dimensional resolution then ensues. As soon as such a three-dimensional data set is acquired, a large multiplicity of image reconstruction methods becomes possible. Thus, by means of known algorithms for subsequent processing three-dimensional representations are generated, or surface analyses are carried out. Arbitrary slices can be selected within the acquired data set. It is of particular interest that in all these subsequent processings the patient no longer has to be in the examination chamber. Once obtained, the three-dimensional data sets can rather be evaluated at an arbitrary time, independent of the actual nuclear magnetic tomography apparatus, at an imaging console.

Due to the substantially higher number of measurements required for a 3D data set in comparison to individual 2D data sets, the overall measurement time is longer in relation to the multi-slice method, however, this disadvantage can be addressed by rapid imaging techniques, such as e.g. EPI (echo planar imaging), FLASH and turbo spin echo. The handling of simple applications in the clinical routine, however, becomes more complicated with the much larger number of possibilities of a 3D data set.

SUMMARY OF THE INVENTION

It is an object of the invention to provide a method for obtaining an MR image composed of a number of slices of a subject, and an apparatus for conducting the method, wherein the advantages of both of the above-described methods are combined at least for a simple application.

The above object is achieved in accordance with the principles of the present invention in a method and apparatus for obtaining a magnetic resonance image from a number of slices of an examination subject wherein a survey image is generated perpendicular to the desired slices, the desired slices are graphically positioned using the survey image, a three-dimensional data set is obtained which includes the desired slices, image data for the desired slices are reconstructed from the three-dimensional data set, and wherein an image of the desired slices is then displayed using the image data.

The three-dimensional data set can be obtained from a subject volume having a position and thickness which is selected so as to include all of the desired slices, or several three-dimensional data sets can be acquired which respectively represent portions of the desired slices.

DESCRIPTION OF THE PREFERRED EMBODIMENTS

Figure 1:
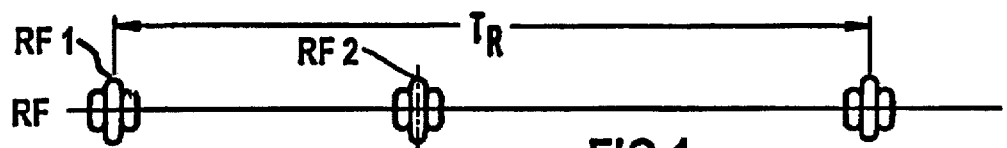
FIGS. 1 through 5 in combination show a pulse sequence for a conventional multi-slice method, for explanation of the prior art.
Figure 2:
Figure 3:
Figure 4:
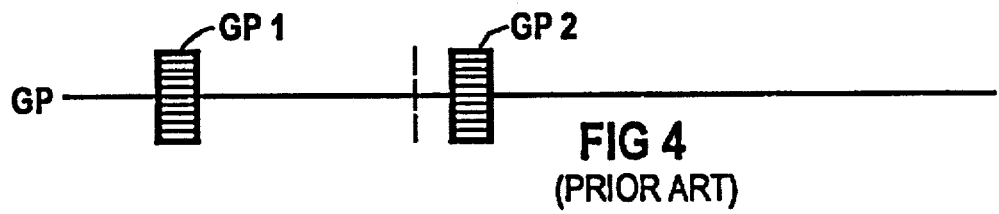
Figure 5:
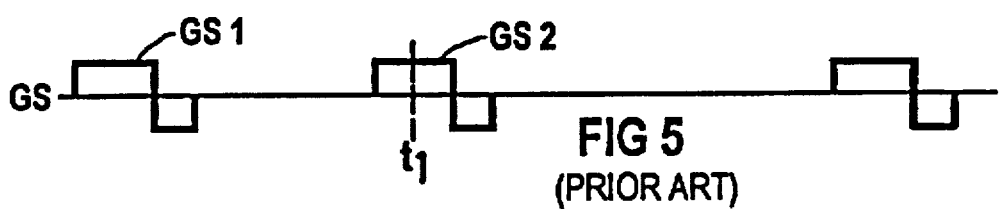

In conventional pulse sequences, radio frequency pulses RF (FIG. 1) are radiated under the effect of slice selection gradients $G_s$ (FIG. 5). There subsequently ensues a rephasing in the direction of the slice, a phase encoding with a phase encoding gradient GP (FIG. 4) and a pre-phasing in the direction of the readout gradient $G_R$ (FIG. 3). A signal S (FIG. 2) is read out under a positive subpulse of the readout gradient $G_R$. This sequence is repeated with a repetition time $T_R$ with different phase coding gradients. The number of frequency repetitions, and thus the number of phase encoding steps, corresponds to the spatial resolution in the direction of the phase encoding gradient $G_P$.

In many cases, several spatially separated slices are examined during an examination. As is known, examination time can be saved by carrying out an excitation of an additional slice already during the repetition time $T_R$, using a second radio frequency pulse RF2 under a second slice selection gradient CS2. The signal S2 from the additional slice occurs separately in time from the signal S1 from the first slice, and thus can be separated from it without difficulty. Also within one repetition time $T_R$, more than one additional slice can be excited. This method is called the multi-slice method.

From the U.S. Pat. No. 4,871,966, mentioned above, it is known to incline the individual slices against one another in a multi-slice method. For this purpose, the direction of the gradients $G_R$, $G_P$ and $G_S$ must be correspondingly modified. As is specified in the cited patent, this is possible without difficulty by means of the superposition of several gradients in a particular coordinate system.

Figure 6:
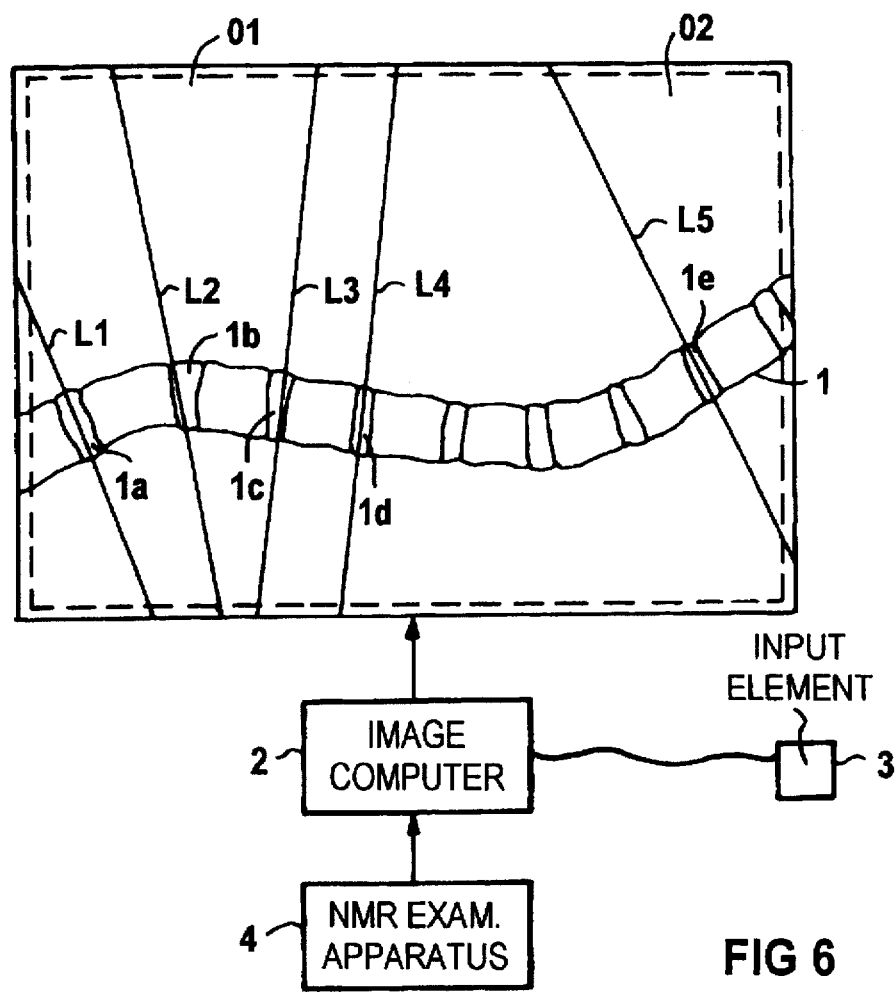
FIG. 6 is a representation of a survey image with selected slices to be obtained by MR imaging.

The course of an examination for the typical case of application, given a relatively severely bent lumbar vertebral region, is shown in FIG. 6. A sagittal section is first obtained through the corresponding region of the spinal column 1, and is shown on a monitor. If, for example, the intervertebral disks 1a to 1e are to be shown in transverse section, lines L1 to L5 are applied in the monitor, which cut these intervertebral disks in the manner best capable of providing diagnostic information. The lines L1 to L5 are defined by means of an input element 3, such as a mouse for the image computer 2 of an NMR examination apparatus 4. The position of a line may, for example, be determined by clicking on two screen points.

In the known multi-slice method, the graphically predetermined information is achieved by obtaining 2D MR data from the slices whose positions are defined by the lines L1 to L5 and generating a composite 2D image from the slice data.

Figure 12:
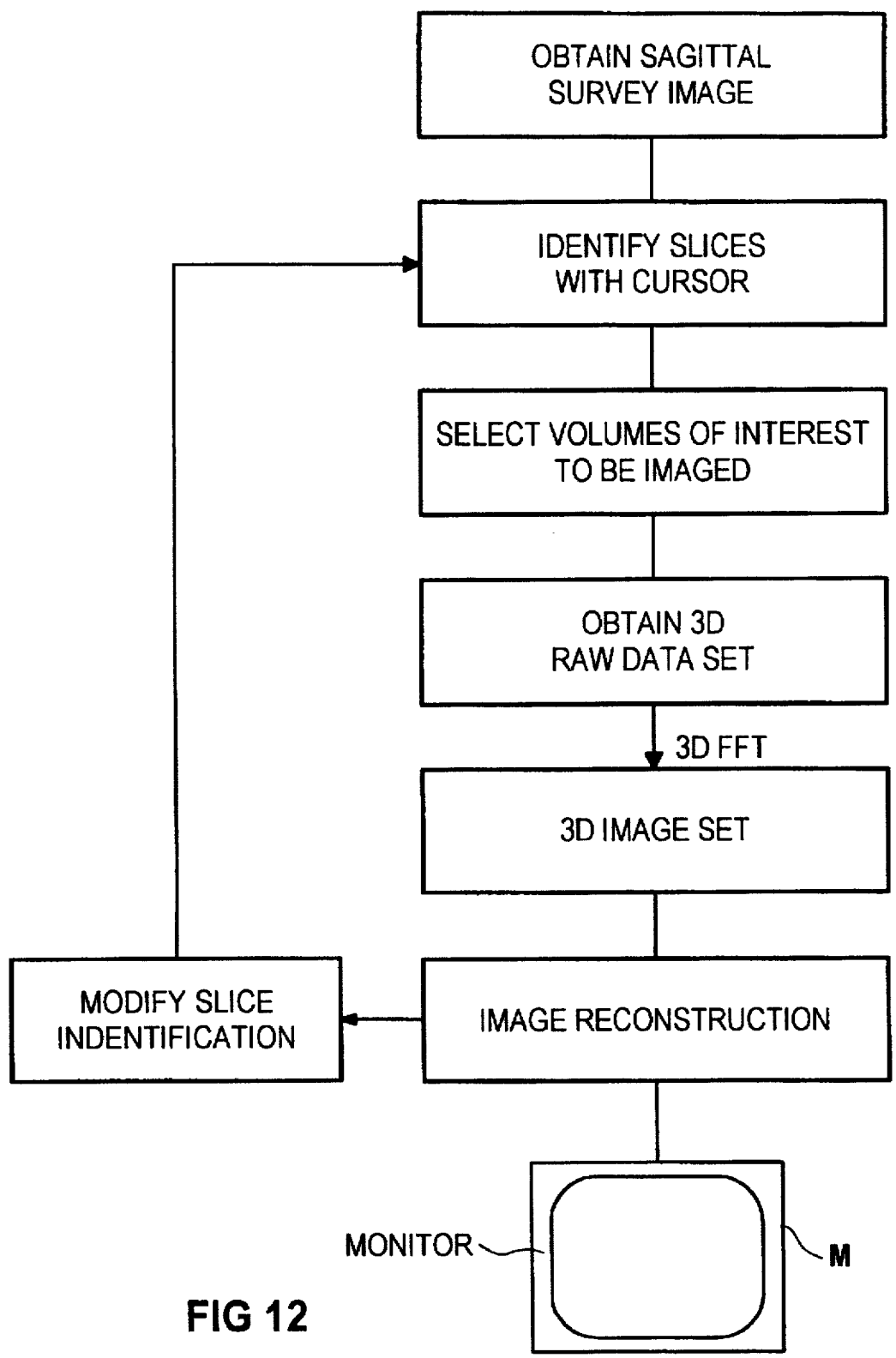
FIG. 12 is a flow diagram of the inventive method.

The exemplary embodiment of the invention described below is at first the same for the user. As can be seen from the block diagram of FIG. 12, a survey image is first likewise generated in the form of a sagittal section, generally on the basis of a 2D data set. The slices to be imaged are subsequently determined on the screen by means of a cursor. In contrast to the known method, however, a three-dimensional data set is now generated. This three-dimensional data set preferably does not extend over the entire subject region, but instead roughly encompasses only the slices 1a to 1e to be imaged. This subject region is shown by broken lines in FIG. 6. It can, for example, be defined by the user in its orientation in the longitudinal direction by means of movable graphic markings on the screen. Alternatively, an algorithm can be used that automatically recognizes, on the basis of the predefined lines L1 to L5, which subject region is to be acquired. The subject region to be acquired need not be continuous. If, for example, it is desired to acquire only the slices 1b, 1c, 1e and 1f, the two object regions O1 and O2, shown by dotted lines, could also be acquired. These, again, could be defined manually or automatically.

Figure 7:
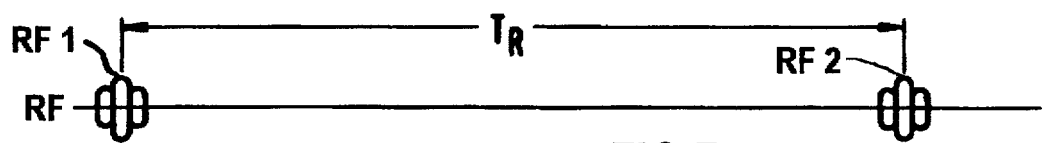
FIGS. 7 through 11 in combination show an example of a pulse sequence for obtaining three-dimensional data sets in accordance with the principles of the present invention.
Figure 8:
Figure 9:
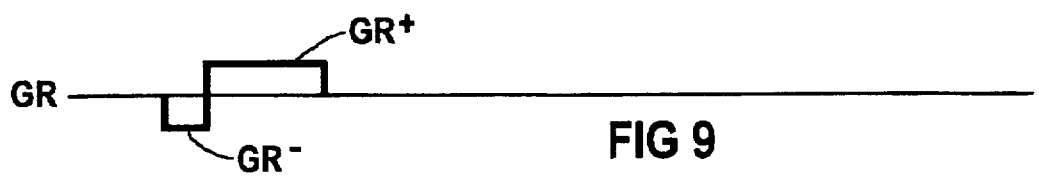
Figure 10:
Figure 11:

According to these specifications, a three-dimensional data set is now generated. A pulse sequence, as represented schematically in FIGS. 7 to 11, can be used for this purpose, for example. Radio frequency pulses RF (FIG. 7) are radiated under slice selection gradients GS (FIG. 11). The profile of the excited disk is determined in a known manner, by means of the frequency spectrum of the radio frequency pulse RF, in connection with the amplitude of the slice selection gradient GS. In contrast to the standard slice selection, the frequency spectrum here is substantially broader, so that not just a thin slice, but rather a volume of defined extension in the direction of the slice selection, is excited.

Figure 13:
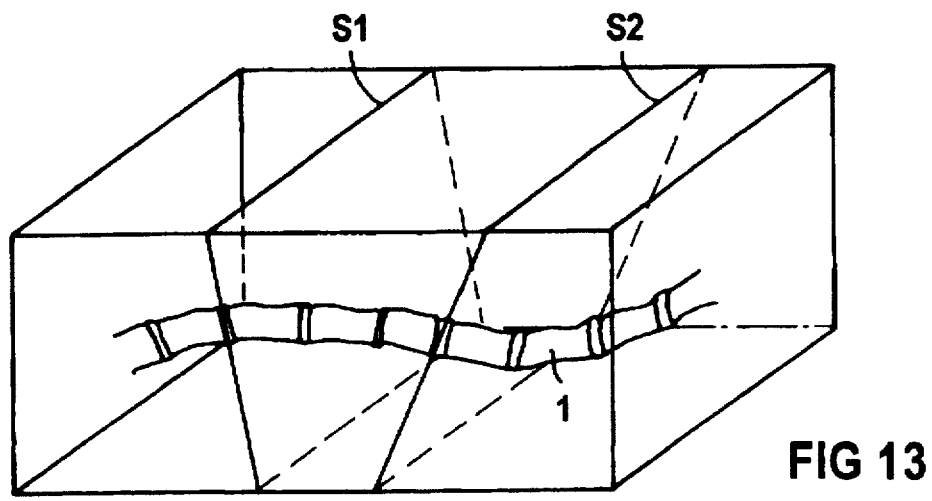
FIG. 13 is a schematic view of a three-dimensional image data set obtained using the inventive method.

The location resolution within the selected volume, or the selected disk, ensues by means of a phase encoding gradient GPS in the slice selection direction following after the excitation. In addition, a phase encoding gradient GP (FIG. 10) and a pre-phasing gradient GR⁻(FIG. 9) are emitted at the same time, which are perpendicular to one another. A nuclear magnetic resonance signal S (FIG. 8) is read out under a readout gradient $GR^+$, this signal subsequently being sampled, digitized and entered into a row of a raw data matrix. This pulse sequence is repeated, with different combinations of values of the phase encoding gradient GP and of the phase encoding gradient GPS in the slice selection direction, until a complete three-dimensional raw data set of the examination region has been obtained. A three-dimensional image data set is obtained from this three-dimensional raw data set in the conventional way, by a three-dimensional Fourier transformation. This image data set is schematically shown in FIG. 13.

From this three-dimensional image data set, corresponding images of the previously selected slices are now reconstructed, and the images are shown on a monitor M. Two of these slices (S1 and S2) are schematically shown in FIG. 13.

Since image data for an entire subject volume are available, bent (curved) slices can also be selected in this way. In this case, the cursor is simply moved along the desired (also bent) line on the screen, and the slice shown is bent according to this line.

If it should turn out, upon observation of the images obtained, that the slice positions are not correct, e.g. because the patient moved between the selection of slices and the measurement, the slice position can be subsequently modified without difficulty, since all the required image data are available within the selected subject volume. The same is true if during the examination it should turn out that the slice was not selected correctly, or if it should prove useful to examine additional slices. Since the required image data in general lie within the selected subject volume, the measurement need not be repeated for this purpose. Rather, the patient can already be removed from the nuclear magnetic tomography apparatus, and the reconstruction can be carried out at an imaging console, independent of the nuclear magnetic tomography apparatus.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance image from a plurality of slices of an examination subject, comprising the steps of:

generating a two-dimensional survey image perpendicular to desired slices of the examination subject which are to be imaged;

graphically positioning said desired slices within said survey image; obtaining a three-dimensional magnetic resonance data set which encompasses said desired slices;

reconstructing said desired slices from said three-dimensional data set to produce image data; and generating an image of the desired slices from said image data.

2. A method as claimed in claim 1 wherein the step of graphically positioning said desired slices comprises graphically positioning arbitrarily curved desired slices using said survey image.

3. A method as claimed in claim 1 comprising the additional step of modifying a position of said desired slices after obtaining said three-dimensional data set during reconstruction of said desired slices.

4. A method as claimed in claim 1 wherein the step of obtaining said three-dimensional data set comprises obtaining said three-dimensional data set from a subject volume having a position and thickness which are selected to include all of said desired slices.

5. A method as claimed in claim 1 wherein the step of obtaining said three-dimensional data set comprises obtaining said three-dimensional data set from a subject volume having a position and thickness which are selected to include a portion of said desired slices.

6. An apparatus for generating a magnetic resonance image from a plurality slices of an examination subject, comprising:

means for generating a two-dimensional survey image perpendicular to desired slices of the examination subject which are to be imaged;

means for graphically positioning said desired slices within said survey image;

means for obtaining a three-dimensional magnetic resonance data set which encompasses said desired slices;

means for reconstructing said desired slices from said three-dimensional data set to produce image data; and means for generating an image of the desired slices from said image data.

* * * * *